US005602576A

United States Patent [19]

Murooka et al.

[11] Patent Number: 5,602,576

[45] Date of Patent: Feb. 11, 1997

[54] INK-JET TYPE RECORDING HEAD AND MONOLITHIC INTEGRATED CIRCUIT SUITABLE THERFOR

[75] Inventors: Fumio Murooka, Atsugi; Junji Shimoda, Chigasaki; Tatsuo Furukawa, Atsugi; Hiroyuki Ishinaga, Tokyo; Hiroyuki Maru, Atsugi; Masaaki Izumida; Yoshinori Misumi, both of Kawasaki, all of Japan

[73] Assignee: Canon Kabushiki Kaisha, Tokyo, Japan

[21] Appl. No.: 632,727

[22] Filed: Apr. 15, 1996

Related U.S. Application Data

[63] Continuation of Ser. No. 170,688, Dec. 21, 1993.

[30] Foreign Application Priority Data

Dec. 28, 1992 [JP] Japan .................................... 4-348483

[51] Int. Cl.$^{6}$ .............................. B41J 2/05; H01L 29/94; H01L 27/092

[52] U.S. Cl. ............................ 347/59; 257/370; 257/371

[58] Field of Search ................................ 347/59, 56, 57, 347/50; 257/370, 371

[56] References Cited

U.S. PATENT DOCUMENTS

| | | | |
|---|---|---|---|
| 4,313,124 | 1/1982 | Hara | 347/57 |
| 4,345,262 | 8/1982 | Shirato et al. | 347/10 |
| 4,459,600 | 7/1984 | Sato et al. | 347/47 |
| 4,463,359 | 7/1984 | Ayata et al. | 347/56 |
| 4,558,333 | 12/1985 | Sugitani et al. | 347/65 |
| 4,608,577 | 8/1986 | Hori | 347/66 |
| 4,723,129 | 2/1988 | Endo et al. | 347/56 |
| 4,740,796 | 4/1988 | Endo et al. | 347/56 |
| 5,045,870 | 9/1991 | Lamey et al. | 347/59 |
| 5,055,859 | 10/1991 | Wakabayashi et al. | 347/57 |
| 5,148,192 | 9/1992 | Izumida et al. | 347/44 |
| 5,175,565 | 12/1992 | Ishinaga et al. | 347/67 |
| 5,214,450 | 5/1993 | Shimoda | 347/10 |
| 5,216,447 | 6/1993 | Fujita et al. | 347/59 |

FOREIGN PATENT DOCUMENTS

| | | |
|---|---|---|
| 54-56847 | 5/1979 | Japan . |
| 59-123670 | 7/1984 | Japan . |
| 59-138461 | 8/1984 | Japan . |
| 60-71260 | 4/1985 | Japan . |

OTHER PUBLICATIONS

Cole, B. "CAD, CMOS and VLSI Are Changing Analog World" Electronics, Dec. 23, 1985, pp. 35–39.

Tsubone, K. et al. "A Smart BiCMOS Driver for 400 DPI Thermal Printing Heads" Proceedings of the IEEE 1988 Custom Integrated Circuits Conference, pp. 5.2.1–4.

*Primary Examiner*—Benjamin R. Fuller
*Assistant Examiner*—Craig A. Hallacher
*Attorney, Agent, or Firm*—Fitzpatrick, Cella, Harper & Scinto

[57] ABSTRACT

A recording head comprises a liquid emission member having an orifice through which an ink is emitted, an electro-thermal converter element for generating a thermal energy which is utilized to emit the ink introduced into the liquid emission member, and a functional element disposed on a same substrate on which the electro-thermal converter element is disposed for driving and controlling the electro-thermal converter element.

The functional element includes an NPN bipolar transistor for driving the electrothermal converter element and a CMOS transistor composed of an NMOS transistor and a PMOS transisfor for controlling an operation of the bipolar transistor.

The NMOS transistor being formed in a P well diffusion layer in an $N^-$ type epitaxial growth layer which is grown on a surface of a P type semiconductor substrate.

The PMOS transistor being formed in an N well diffusion layer in the $N^-$ type epitaxial growth layer which is grown on the surface of the P type semiconductor substrate.

4 Claims, 6 Drawing Sheets

INK-JET TYPE RECORDING HEAD AND MONOLITHIC INTEGRATED CIRCUIT SUITABLE THERFOR

This application is a continuation, of application Ser. No. 08/170,688 filed Dec. 21, 1993, now abandoned.

BACKGROUND OF THE INVENTION

1. Field of the Invention

The present invention relates to an ink-jet type recording head and a monolithic integrated circuit suitable therefor.

2. Related Background Art

An ink-jet type recording head, which emits droplets of ink by boiling bubbles made of ink, has been widely used for a various kind of recording devices such as printers or video printers which are suitable and well utilized as output terminals for copiers, facsimiles, word processors and host computers.

The recording head of this kind is constructed such that an ink emitting portion having an orifice through which ink is emitted, an electrothermal converter generating thermal energy with which the ink, supplied to the ink emitting portion, is emitted outside, and a driving component for driving the electro-thermal converter are integrally consolidated on the same substrate. A similar kind of the structure was invented by the same inventors of the present application and filed as U.S. Patent Application under the title "Recording Apparatus, Recording Head and Substrate Therefor" on Jul. 31, 1992, bearing Ser. No. 922,870, in which a head is also proposed having the electro-thermal converter which is integrated with logic circuits such as a shift register, a latch circuit, and the like on the same substrate. FIG. 1 illustrates a pattern layout disposed on a substrate 31 of an ink-jet type recording head in accordance with the above mentioned application. An electro-thermal converter 32, which is constituted as an array composed of a plurality of elements, is located along the vicinity of one side of the substrate 31 on grounds that ink is supplied from both surfaces of the one side of the substrate and that the flow resistance can be reduced if the electro-thermal converter 32 is located in the vicinity of an ink supplying room which is usually located near the one side of the substrate 31 to thereby to accomplish high speed accessibility of ink projection.

This high speed accessibility can be further improved if the electro-thermal converter 32 is located within 1,000 μm in length from the side surface of the substrate 31. Further, the closer the electro-thermal converter 32 is located toward the side surface, the more the effect is improved.

There are disposed electric contacts 37, 38, 39 on both surfaces of the substrate 31 at the vicinity of another both sides thereof.

The $V_H$ contact 37 constitutes a contact of a $V_H$ wiring portion 33 which supplies electric energy (pulse) to each of respective electro-thermal converters. The GND contact 38 constitutes a contact of a ground (GND) wiring portion 35 to which the supplied electric energy is grounded. The logic contact 39 constitutes a signal contact of a logic circuit 36 which is composed of a plurality of logic circuits.

There is also disposed a transistor array 34 located between the $V_H$ wiring 33 and the GND wiring portion 35 and connected respectively, each of the electro-thermal converters so as to selectively drive each of the converters. The transistor array 34 is connected such that each of the transistors of the array 34 is controlled by the logic circuit 36.

FIG. 2 shows a cross-sectional view illustrating a part of a monolithic integrated circuit chip in which a heater board is incorporated and which is produced by way of experiment by the inventors of the above described application. There are formed in the same substrate an electro-thermal converter 11, a high voltage proof bipolar NPN transistor 7 which drives the converter 11, and a logic circuit which is constituted by a CMOS circuit composed of PMOS and NMOS transistors. An $N^-$ type epitaxial layer 5 is grown on the surface of a P type silicon substrate 1 in which an $N^+$ buried diffusion layer 2 is formed.

An NPN bipolar transistor region 7, which is composed of a $P^-$ type diffusion layer 14, a $P^+$ type diffusion layer 12, and $N^+$ type diffusion layer 13 and a first layer aluminum wiring 10, is formed in the $N^-$ type epitaxial layer 5.

A P well diffusion layer 4 is formed to isolate each of the composed components electrically in the epitaxial layer 5 so as to be reached a $P^+$ type buried diffusion layer 3 which is also formed in the substrate 1.

An NMOS transistor region 8, which is composed of an $N^+$ type diffusion layer 13 serving a source/drain, a gate electrode 15 and the first layer aluminum wiring 10, is formed in the P well diffusion layer 4. The P well diffusion layer 4 is also utilized as an isolation layer which isolates the components from the surface.

A PMOS transistor region 9, which is composed of a $P^+$ type diffusion layer 12 serving a source/drain, a gate electrode 15 and the first layer aluminum wiring 10, is formed in the $N^-$ type epitaxial layer 5 on the $N^+$ type buried diffusion layer 2.

In the drawing, a reference numeral 16 denotes an $N^+$ type diffusion layer; numerals 17, 18 and 19 denote a silicon dioxide ($SiO_2$) film, an insulating film and an aluminum inter-layer insulating film, respectively; a numeral 20 denotes a second layer aluminum wiring; and numerals 21 and 22 denote a surface passivation film and a tantalum surface passivation film, respectively.

Under the above described structure, the NPN transistor in the region 7 is formed in the relatively thicker epitaxial layer 5 having 8 to 10 μm in thickness in order to maintain high voltage proof against a power source voltage determined by an energy amount supplied to the electro-thermal converter 11.

Accordingly, the P well diffusion layer 4, which serves as an isolation region on the surface of a silicon, must be formed adjacent to the NPN transistor in the region 7 with a relatively large gap therebetween.

As described above, the conventional structure shown in FIG. 2 incorporates the PMOS transistor in the epitaxial growth layer 5 in order to maintain high voltage proof, which requires a wide space region as the region 9 for the PMOS transistor comparing with the region 8 for the NMOS transistor.

FIG. 3 shows an equivalent circuit of the integrated circuit including the portion illustrated in FIG. 2.

A reference numeral 41 denotes an electro-thermal converter array; 42 and 43 a first and a second transistors; 44 a logic gate; 45 a latch logic; 46 a shift register; 47 a heater to $V_H$ connection wiring; 48 a $V_H$ wiring; 49 GND wiring; 50 an enable wiring; 51 a latch wiring; 52 a serial data wiring; and 53 a clock wiring.

The above described structure has, however, following problems which must be solved.

In case of the layout shown in FIG. 2, it is desired to dispose the electro-thermal converter in parallel with the NPN transistor, the logic circuit, the latch circuit and the shift register all of which are used for driving the electro-thermal converter. The layout of the electro-thermal converter elements must be arrayed with a pitch determined depending on a recording density.

The recording density having 360 dpi requires 70.5 μm in pitch.

The NPN transistor, the logic circuit, the latch circuit and the shift register are preferably to be arrayed with the same pitch as that of the electro-thermal converter eelemnts by enhancing a density of the array.

FIG. 4 illustrates a pattern layout disposed on a substrate for a head produced by way of the experiment.

An array density of the electro-thermal converter can be increased by optimizing a shape and a sheet resistance of the converter. However, if the effort is down to cope with the increase of the recording density with an efficiency of inter-layout wiring being maintained high by disposing in a manner described above the electro-thermal converter be in parallel with the logic circuit, the latch circuit and the shift register, array lengths of the logic circuit, the latch circuit and the shift register will be extremely longer than that of the electro-thermal converter resulting in the size of the substrate inevitably becoming larger thereby inhibiting miniaturization of products and increasing the manufacturing cost.

SUMMARY OF THE INVENTION

A primary object of the present invention is to provide an ink-jet type recording head which can resolve the foregoing problems by increasing an array density to prevent a size of the substrate being increased.

A further object of the present invention is to provide a monolithic integrated circuit suitable for the above mentioned ink-jet type recording head.

To accomplish the above objects, there is provided a recording head having a liquid emitting member having an orifice through which an ink is emitted; an electro-thermal converter element for generating a thermal energy which is utilized to emit the ink introduced into the liquid emitting member; and a functional element disposed on a same substrate on which the electro-thermal converter element is disposed for driving and controlling the electro-thermal converter element; wherein the functional element includes an NPN bipolar transistor for driving the electro-thermal converter element and a CMOS transistor composed of an NMOS transistor and a PMOS transistor for controlling an operation of the bipolar transistor; for NMOS transistor being formed in a P well diffusion layer in an $N^-$ type epitaxial growth layer which is grown on the surface of the P type semiconductor substrate.

In accordance with another aspect of the present invention, there is provided a monolithic integrated circuit having an electro-thermal converter element for generating a thermal energy which is utilized to emit an ink; a bipolar transistor for driving the electro-thermal converter element; and a CMOS transistor composed of an NMOS transistor and a PMOS transistor disposed on a same substrate on which the electro-thermal converter element and the bipolar transistor are disposed for controlling an operation of the bipolar transistor; wherein the NMOS transistor is formed in a P type well diffusion layer and the PMOS transistor is formed in an N type well diffusion layer.

Since the present invention employs a twin well structure for MOS transistors in a CMOS circuit constituting the logic circuit, the latch circuit and the shift register, all of which drive the electro-thermal converter, the array density of the components can be increased enabling to cope with the increase of the recording density without enlarging the size of the substrate.

BRIEF DESCRIPTION OF THE DRAWINGS

These and other features and advantages of the invention will be more clearly understood from the following detailed description of the preferred embodiments with reference to the accompanying drawings in which.

DETAILED DESCRIPTION OF THE PREFERRED EMBODIMENTS

Figure 5A:
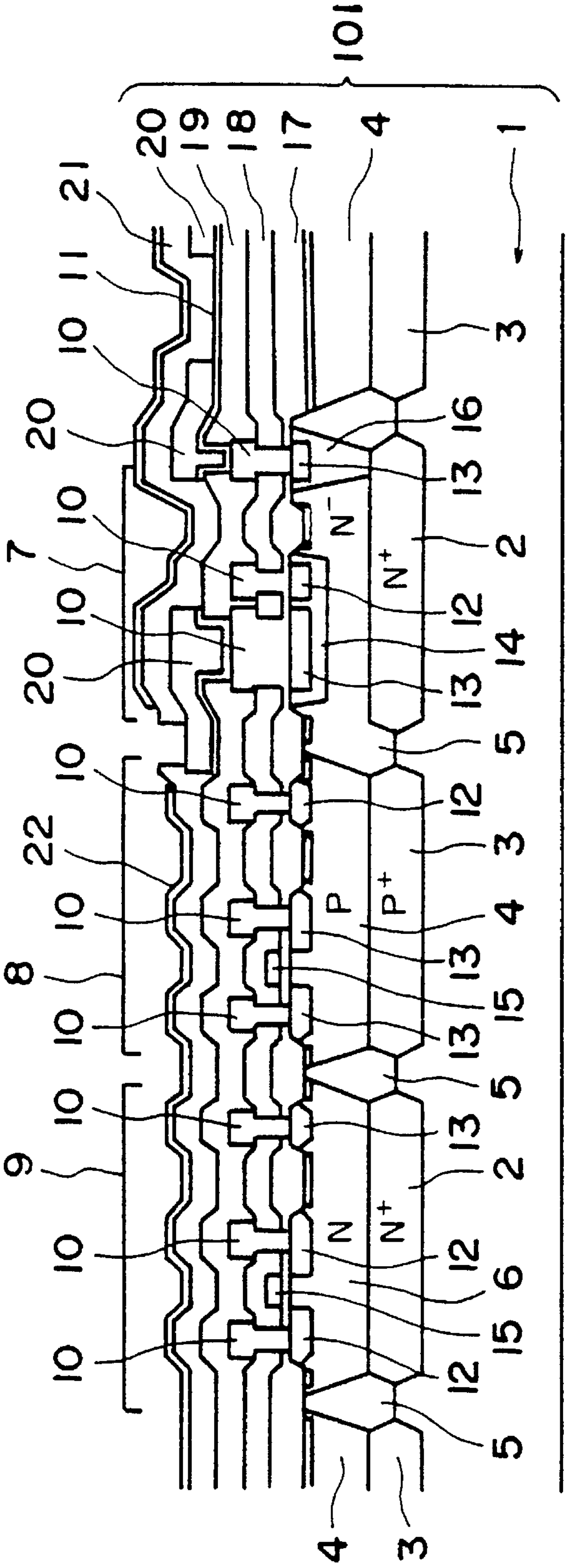
FIG. 5A shows a partial cross-sectional view illustrating a monolithic integrated circuit according to the present invention in which a heater board is incorporated.
Figure 5B:
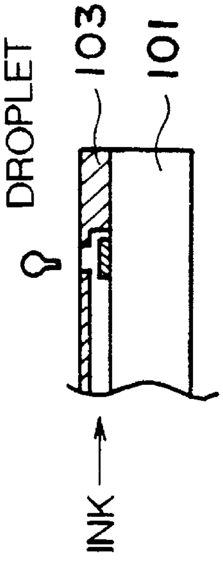
FIG. 5B shows another partial cross-sectional view illustrating a monolithic integrated circuit according to the present invention in which a heater board is incorporated.

One preferred embodiment according to the present invention is shown in FIGS. 5A and 5B.

In FIG. 5A, the reference numeral 1 denotes a P type silicon substrate; 2 an $N^+$ type buried layer forming a collector region of an NPN transistor; 3 a $P^+$ type buried diffusion layer formed in the substrate to isolate each of components from the substrate; 4 a P type P well diffusion layer for use of isolation from the surface together with formation of the NPN transistor; 5 an $N^-$ type epitaxial growth layer; and 6 an N type N well diffusion layer for use to a form a PMOS transistor. Both the P well diffusion layer 4 and the N well diffusion layer 6 are formed in the $N^-$ type epitaxial growth layer 5.

FIG. 5B shows an illustration that an orifice plate 102 is disposed on a head substrate 101 to form an outlet and a flow path of ink.

In FIG. 5A, a region 7 denotes a bipolar NPN transistor formed in the $N^-$ type epitaxial growth layer 5 to have a $P^-$ type diffusion layer 14, a $P^+$ type diffusion layer 12, an $N^+$ type diffusion layer 13 and an aluminum wiring 10 by way of various diffusion and wiring processes.

A region 8 denotes an NMOS transistor formed in the P well diffusion layer 4 to have the $N^+$ type diffusion layer 13, a gate electrode 15, the $N^+$ type diffusion layer 12 and the aluminum wiring 10 by way of various diffusion and wiring processes. A region 9 denotes a PMOS transistor formed in the N well diffusion layer 6 to have the $P^+$ type diffusion layer 12, the gate electrode 15, the $N^+$ type diffusion layer 13 and the aluminum wiring 10 by way of various diffusion and wiring processes.

Figure 1:
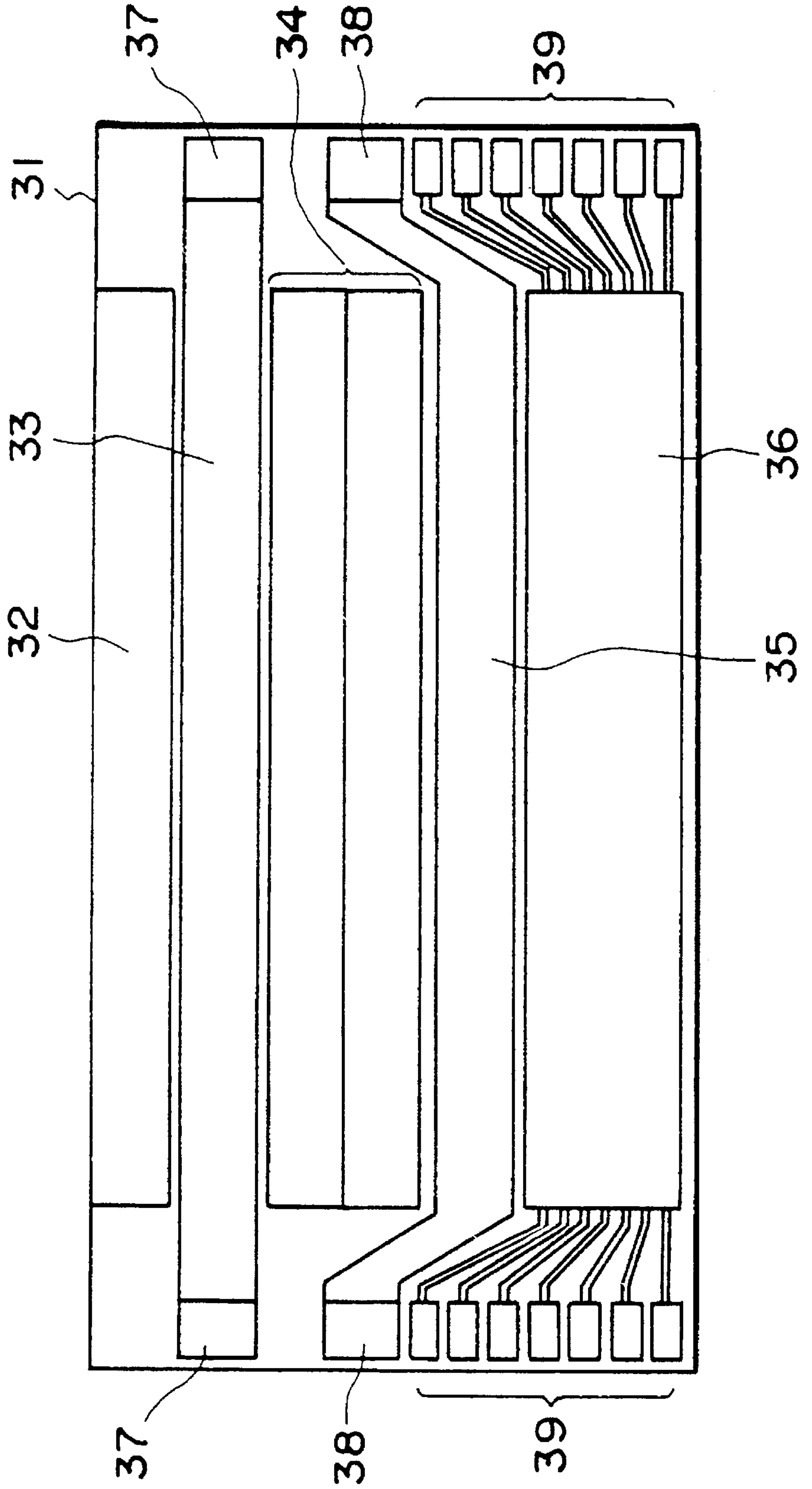
FIG. 1 shows a conventional pattern layout diagram disposed on a substrate.
Figure 2:
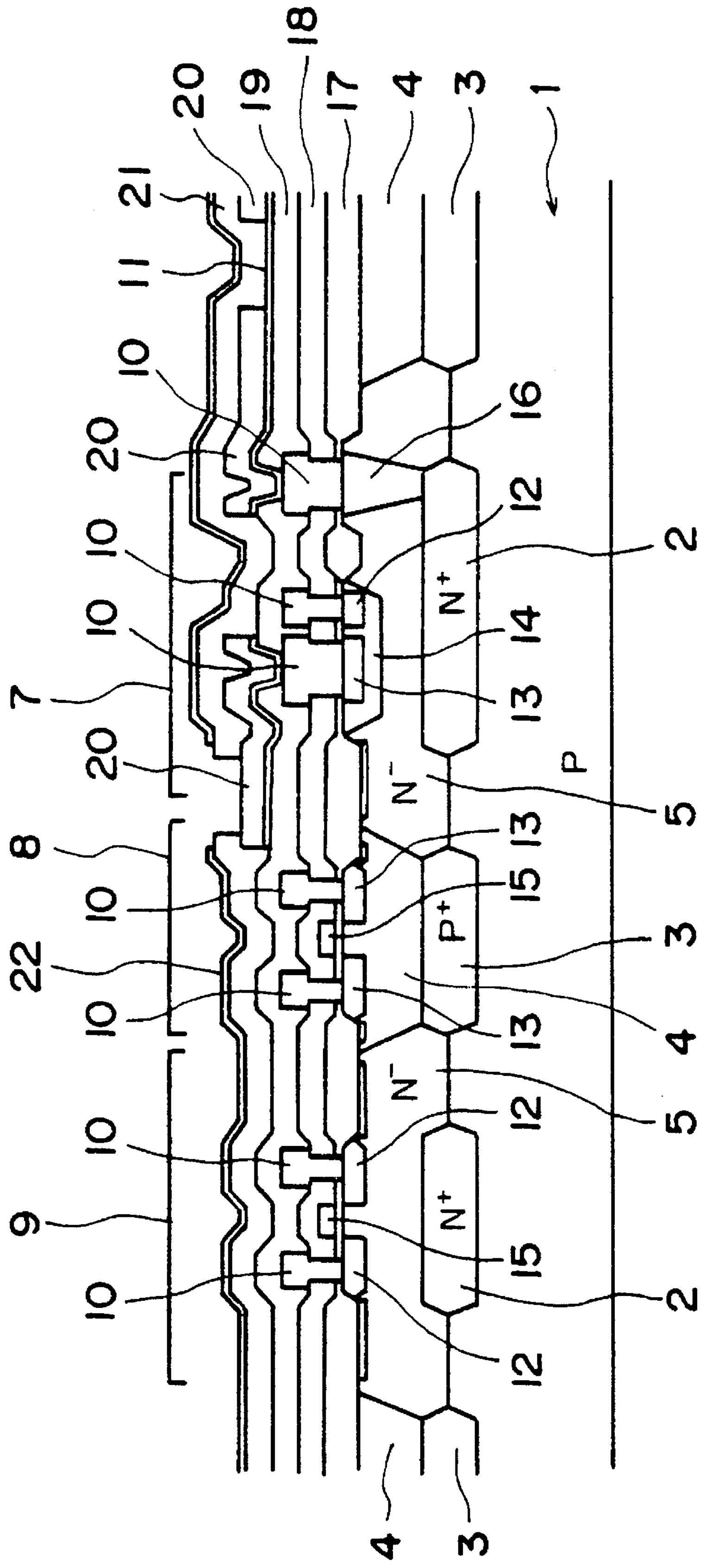
FIG. 2 shows a partial cross-sectional view illustrating a monolithic integrated circuit in which a heater board is incorporated produced by way of experiment.
Figure 3:
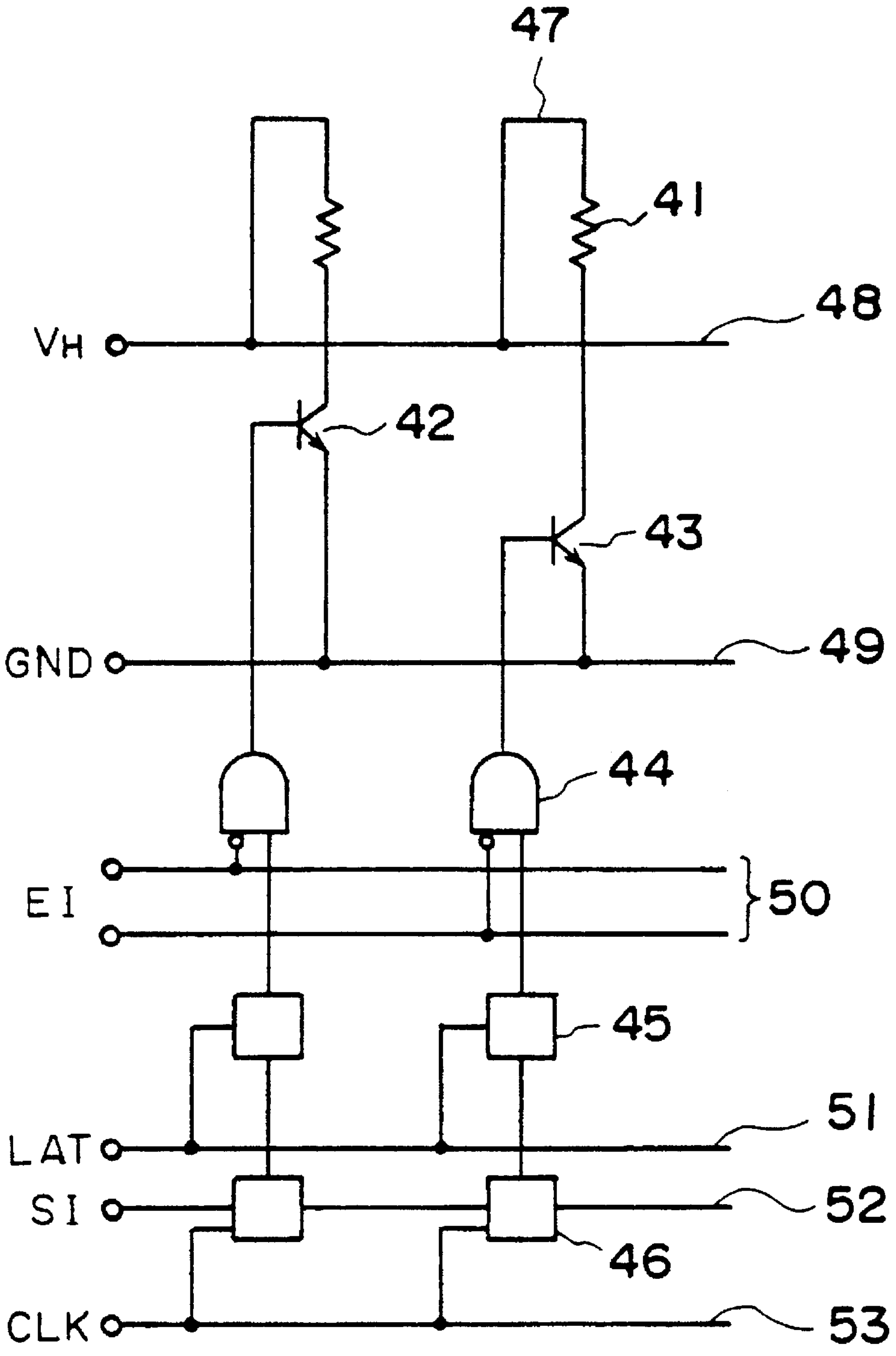
FIG. 3 shows an equivalent circuit diagram of a part of the circuit illustrated in FIG. 2.
Figure 4:
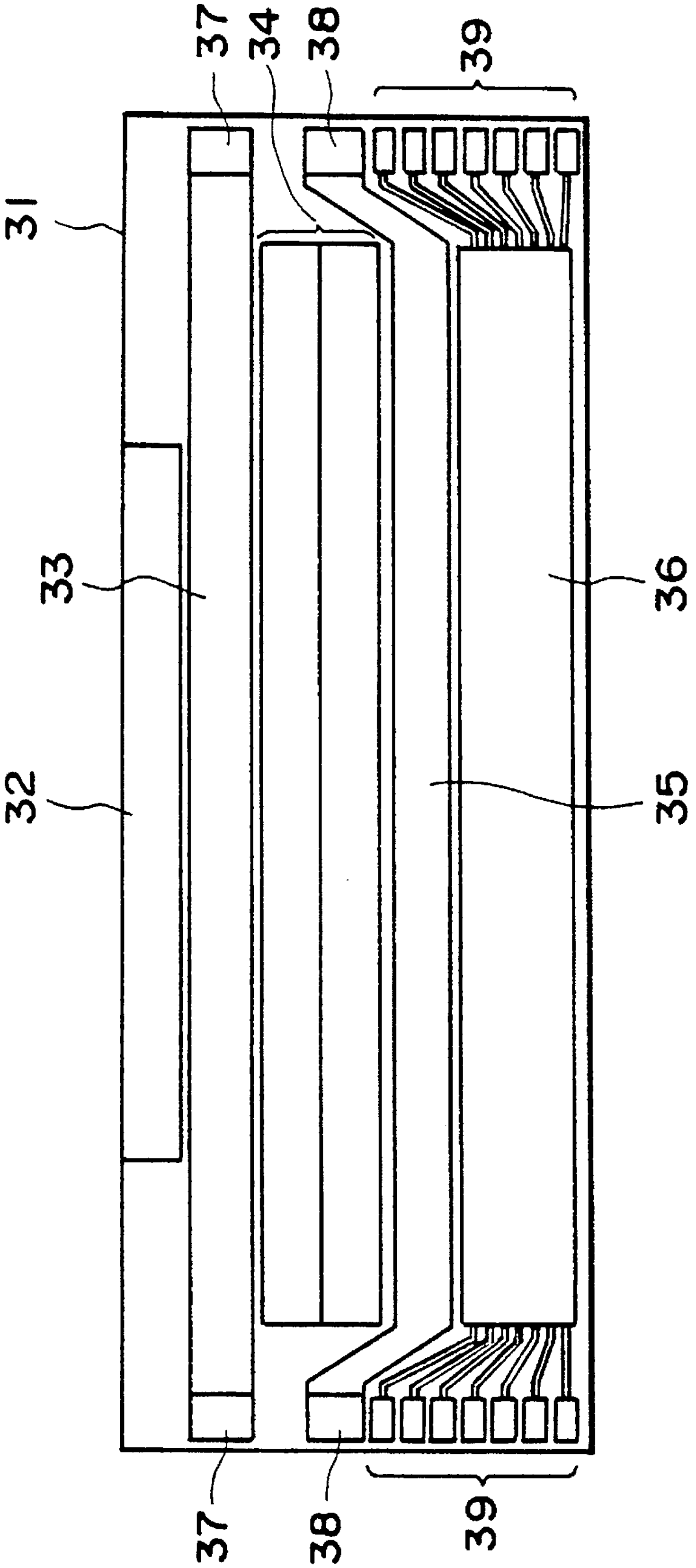
FIG. 4 shows a pattern layout diagram disposed on a substrate for a head produced by way of the experiment.

A reference numeral 11 denotes an electro-thermal converter element connected to the aluminum wiring line to interconnect with the collector of the for example, composed of $H_fB_z$ and extended to an ink bipolar NPN transistor. The converter element 11 is, orifice, which is not shown, to emit drops of ink by heating the ink. An operation of the NPN bipolar transistor for driving the electro-thermal converter element 11 is controlled by a shift register, a latch circuit and a logic gate, all of which are constituted by CMOS transistors having NMOS and PMOS transistors. The equivalent circuit of the structure shown in FIG. 5A the same as that shown in FIG. 3. In FIGS. 5A and 5B, a reference numeral 16 denotes an $N^+$ type diffusion layer; 17, 18 and 19 a silicon dioxide ($SiO_2$) film, an insulating film and an insulating film for aluminum inter-layer, respectively; 20 a second layer aluminum wiring; 21 and 22 a surface passivation film and a tantalum surface passivation film.

Under the structure described above, the NPN transistor in the region 7 is formed in the relatively thicker epitaxial layer 5 having 8 to 10 μm in thickness to maintain high voltage proof against the power source voltage which is determined by an energy amount supplied to the electro-thermal converter element 11.

As described above, the conventional structure provides the PMOS transistor in the epitaxial growth layer 5, a thickness of which is determined by maintaining high voltage proof of the NPN transistor, thereby requiring an extremely large surface area as the region 9 where the PMOS transistor is formed as compared to the region 8 where the NMOS transistor is formed.

Contrary to the above, the structure according to the present invention provides the PMOS transistor and the NMOS transistor in the N well and the P well diffusion layers, respectively, thereby keeping the respective MOS transistors with nearly same size. The shift register, the latch circuit and the logic gate which are constituted in the substrate require only the voltage proof against the power source voltage, for example 5 V or less than 5 V, which enables the operation of the CMOS structure circuit so that a gap length between each of the diffusion layers which constitute MOS transistors can be designed in a manner to have a permissible range in order to satisfy the above condition.

When a process technology enabling to obtain a further fine structure is employed to constitute each components, the shift register, the latch circuit and the logic gate can be realized with high density.

The present invention reveals an excellent advantage on a reading head or a reading device, when applied thereto, which incorporates, among ink-jet type recording apparatus, means for generating heat energy, such as an electro-thermal converter, a laser emitting apparatus, etc., as the energy to be utilized to emit ink and causes to change a state of the ink by applying the heat energy thereto, because the present invention realizes a high density and high precision reading technology. The typical structure and principle according to the present invention are preferably employed, for example, those disclosed as fundamental ones in the U.S. Pat. Nos. 4,723,129 and 4,740,796.

Even though the reading head according to the present invention is applicable to either "on-demand type" or "a continuous type", it is more effective to be applied to the on-demand type because at least one driving signal, which causes an abrupt temperature elevation to exceed the core boiling temperature corresponding to each recording information, is applied to the electro-thermal converter which is disposed corresponding to both the sheet preserving ink and the ink flow path in order to have the electro-thermal converter generated the heat energy. Accordingly, a film boiling occurs at the heat working surface of the recording head resulting to form bubbles in the ink which correspond to each of the driving signals. The ink are emitted through the orifice in accordance with growth and shrinkage of the bubbles to form at least one droplet. The driving signal is preferably supplied in a form of pulse trains so that the growth and shrinkage of the bubbles can be adequately performed in response to the driving signal to accomplish an excellent ink emission with particular high accessibility.

The driving signal having a pulse shape can be utilized as that disclosed in the U.S. Pat. Nos. 4,463,359 and 4,345,262.

Further excellent recording can be achieved by employing conditions disclosed in the U.S. Pat. No. 4,313,124, the invention of which relates to a temperature elevation rate of the heat working surface set forth above.

The present invention is not limited to the structure, as a reading head, having in combination, the orifice, the ink flow path and the electro-thermal converter which constitutes a straight liquid flow path or a right angle liquid flow path, but to include the structure in which the heat working portion is located at the bent region disclosed in the U.S. Pat. Nos. 4,558,333 and 4,459,600.

In addition, the present invention is also effective if employed either an a structure where a common slit of plural, as electro-thermal converters serves as the orifice disclosed in the Japanese Laid-Open Patent Application No. 59-123670 or in a structure where an opening to absorb a pressure wave of heat energy is faced relative to the emitting portion, as disclosed in the Japanese Laid-Open Patent Application No. 59-138461.

In other words, the recording head, whatever shape through it is, according to the present invention can surely and effectively record.

The present invention is also effectively applicable to a full line type recording head having a length which corresponds to the maximum width of a recording medium of the recording device. This kind of recording heads can be constructed such that the length is satisfied either by combination of the plural recording heads or by integrally constituted as one recording head.

Figure 6A:
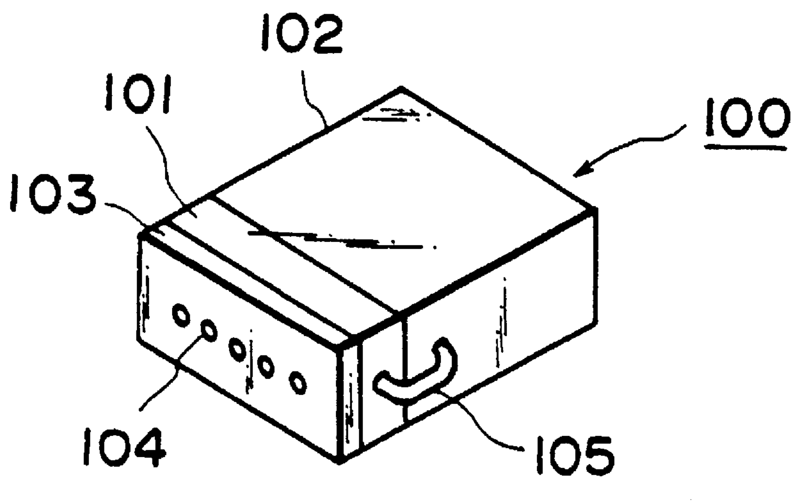
FIG. 6A shows an example of a recording head to which the present invention is applied.

FIG. 6A shows an example of the recording head, wherein the numeral 101 represents the head substrate illustrated in FIG. 5B; the numeral 102 an ink tank; the numeral 103 an orifice plate having a plurality of ink emitting orifices; and the numeral 105 an ink supplying pipe. In addition, besides the serial type recording head set forth above, other types of recording heads, i.e., one that is fixed to the body of the recording device, one that is an interchangeable chip type enabling an electrical connection with the body of the device when installed into the body of the device and enabling the ink supply from the body of the device, or one that is a cartridge type incorporating the ink tank integrally into the recording head can be effectively applied to the present invention.

Figure 6B:
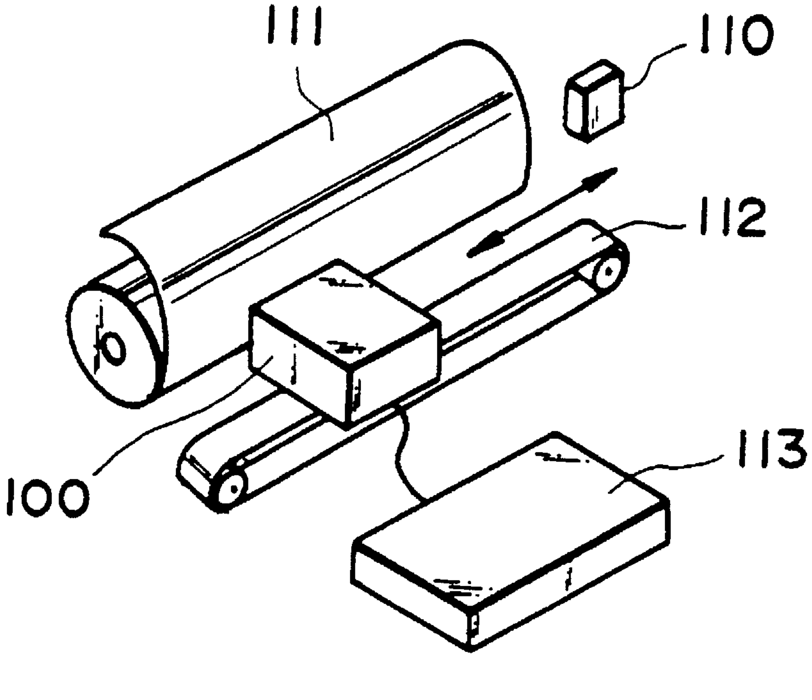
FIG. 6B shows an example of the recording device to which the present invention is applied.

FIG. 6B shows a recording device, wherein the 1 numeral 11 represents a recording medium; the numeral 112 head carrying means; and the numeral 113 a control circuit. In addition, projection recovery means 110 or preliminary supplemental means for the recording head 100 can be supplemented to stabilize more the advantage of the present invention. More concretely, capping means, pressing or absorbing means, preliminary heating means constituted by either the electro-thermal converter, other thermal elements or the combination thereof, and preliminary emission means for use of other emitting excepting the recording can be supplemented to the recording head.

There can be various modifications as to the type and the number of the recording head.

For example, one single recording head corresponding to a single color ink or a plurality of recording heads corresponding to a plurality of inks which reveal different recording colors and densities can be employed. In other words, the recording device can be realized not only by employing a single recording head having a single color mode which reveals a single principal color, like black, but also by employing either a recording head integrally incorporated into the body of the device or a combination of a plurality of the recording head.

The present invention is effectively applied to the recording device incorporating at least one recording mode selected from a plural color mode revealing different multiple colors and a full color mode realized by mixing multiple colors. In addition, although above described embodiment according to the present invention employs liquid ink, the ink is not restricted to be liquid but can be utilized the ink which stays solid less than a room temperature and softens or becomes liquidized at the room temperature. The ink can be also utilized which is liquidized when applied a recording signal because the ink utilized under an ink-jet system is usually controlled in temperature into a range of 30° C. to 70° C. to keep the viscosity in a stabilized emission range. The ink, which stays normally as it is a solid state and a liquid state when heated, can be utilized in order to positively have the heat elevation energy utilized as the energy to change the ink from a solid state to a liquid state or in order to prevent evaporation of the ink. In any event, the present invention is applicable in case that is utilized the ink liquidized when applied heat energy such that liquid state ink is projected when a recording signal accompanying heat energy is applied solid state ink or that liquid state ink is solidified when it reaches to a recording medium.

Above described ink, which is disclosed in the Japanese Laid-Open Patent Application No. 54-56847 or 60-71260, can be faced relative to the electro-thermal converter with preserved in either liquid state or solid state at a recess or a penetrated hole of porous sheet material.

The film boiling method described above is most effectively applied to the ink described above in accordance with the present invention.

Various modifications can be considered as the ink-jet type recording device to which the present invention is applied. Examples are a video signal output terminal for information processing devices such as computers, a copier in combination with readers, and a facsimile device having a transceiver function.

As described above, since the present invention provides both the N type N well diffusion layer and the P type P well diffusion layer in the N type epitaxial layer which is usually utilized to form the bipolar NPN transistor and incorporates the PMOS and NMOS transistors into the N well layer and the P well layer, respectively, the formation regions of both MOS transistors can be approximately equal each other thereby improving the array density of the shift register, the latch circuit and the logic gate.

Therefore, the array density of functional elements for a driving system can be well improved to cope with the multi-bit trend of the electro-thermal converter element accompanying high recording density.

What is claimed is:

1. A recording head which records with an ink, comprising:

a plurality of ink orifices;

an orifice plate comprising a plurality of electrothermal converters each for generating thermal energy to heat the ink to emit the ink from an associated said ink orifice, said electrothermal convertors being disposed in an array;

said common substrate including said plurality of electrothermal converter elements and having a surface side and an array of a plurality of NPN transistors for conducting electrical currents to said electrothermal converters, and an array of a plurality of CMOS transistors for controlling operation of said NPN transistors, said substrate comprising:

a P-type semiconductor common substrate;

a first and a second N-type semiconductor buried layer each provided on the P-type common substrate;

a P-type semiconductor buried layer provided on the P-type common substrate;

an N-type semiconductor epitaxial layer provided on the first and the second N-type semiconductor buried layer and the P-type semiconductor buried layer;

a P-well of a P-type semiconductor material provided in the N-type semiconductor epitaxial layer;

an N-well of an N-type semiconductor material provided in the N-type semiconductor epitaxial layer;

a P-type semiconductor diffusion layer provided in the N-type semiconductor epitaxial layer and including a P-type semiconductor source and a drain region which are provided in the N-type well; and an N-type semiconductor diffusion layer provided in the P-type semiconductor diffusion layer and including an N-type semiconductor source and a drain region which are provided in the P-type well, wherein the buried layer of the first N-type semiconductor, the N-type semiconductor epitaxial layer, the P-type semiconductor diffusion layer provided in the N-type epitaxial layer, and the N-type semiconductor diffusion layer provided in the P-type semiconductor diffusion layer together comprises one said NPN transistors in said array of the NPN transistors, wherein the N-type semiconductor source and drain region provided in the P-type well comprise an NMOS transistor, and the P-type semiconductor source and drain region comprise a PMOS transistor, and the NMOS transistor and the PMOS transistor comprise one said CMOS transistors in said array of the CMOS transistors; and wherein the array of the electrothermal converters, the array of the NPN transistors for flowing current into the electrothermal converters, and the array of the CMOS transistors for controlling operation of the NPN transistors are each arranged at the surface side of the common substrate in parallel to one another, and integrally.

2. An integrated circuit of a recording head which records with an ink and having an orifice plate having a plurality of ink orifices and connected to a common substrate comprising:

a plurality of electrothermal converters each for generating thermal energy to heat the ink to emit the ink from an associated said ink orifice, said electrothermal convertors being disposed in an array;

said common substrate including said plurality of electrothermal converter elements and having a surface side and an array of a plurality of NPN transistors for conducting electrical currents to said electrothermal converters, and an array of a plurality of CMOS transistors for controlling operation of said NPN transistors, said substrate comprising:

a P-type semiconductor common substrate;

a first and a second N-type semiconductor buried layer each provided on the P-type common substrate;

a P-type semiconductor buried layer provided on the P-type common substrate;

an N-type semiconductor epitaxial layer provided on the first and the second N-type semiconductor buried layer and the P-type semiconductor buried layer;

a P-well of a P-type semiconductor material provided in the N-type semiconductor epitaxial layer;

an N-well of an N-type semiconductor material provided in the N-type semiconductor epitaxial layer;

a P-type semiconductor diffusion layer provided in the N-type semiconductor epitaxial layer and including a P-type semiconductor source and a drain region which are provided in the N-type well; and an N-type semiconductor diffusion layer provided in the P-type semiconductor diffusion layer and including an N-type semiconductor source and a drain region which are provided in the P-type well, wherein the buried layer of the first N-type semiconductor, the N-type semiconductor epitaxial layer, the P-type semiconductor diffusion layer provided in the N-type epitaxial layer, and the N-type semiconductor diffusion layer provided in the P-type semiconductor diffusion layer together comprises one said NPN transistor in said array of the NPN transistors, wherein the N-type semiconductor source and drain region provided in the P-type well comprise an NMOS transistor, and the P-type semiconductor source and drain region comprise a PMOS transistor, and the NMOS transistor and the PMOS transistor comprise one said CMOS transistor in said array of the CMOS transistors; and wherein the array of the electrothermal converters, the array of the NPN transistors for flowing current into the electrothermal converters, and the array of the CMOS transistors for controlling operation of the NPN transistors are each arranged at the surface side of the common substrate in parallel to one another, and integrally.

3. A recording head which records with an ink, comprising:

a plurality of ink an orifice plate comprising orifice and connected to a common substrate a plurality of electrothermal converters each for generating thermal energy to heat the ink to emit the ink from an associated said ink orifice, said electrothermal convertors being disposed in an array;

said common substrate including said plurality of electrothermal converter elements and having a surface side and an array of a plurality of NPN transistors for conducting electrical currents to said electrothermal converters, and an array of a plurality of CMOS transistors for controlling operation of said NPN transistors, said substrate comprising:

a P-type semiconductor common substrate;

a first and a second N-type semiconductor buried layer each provided on the P-type common substrate;

a P-type semiconductor buried layer provided on the P-type common substrate;

an N-type semiconductor epitaxial layer provided on the first and the second N-type semiconductor buried layer and the P-type semiconductor buried layer;

a P-well of a P-type semiconductor material provided in the N-type semiconductor epitaxial layer;

an N-well of an N-type semiconductor material provided in the N-type semiconductor epitaxial layer;

a P-type semiconductor diffusion layer provided in the N-type semiconductor epitaxial layer and including a P-type semiconductor source and a drain region which are provided in the N-type well; and an N-type semiconductor diffusion layer provided in the P-type semiconductor diffusion layer and including an N-type semiconductor source and a drain region which are provided in the P-type well, wherein the buried layer of the first N-type semiconductor, the N-type semiconductor epitaxial layer, the P-type semiconductor diffusion layer provided in the N-type epitaxial layer, and the N-type semiconductor diffusion layer provided in the P-type semiconductor diffusion layer together comprises one said NPN transistor in said array of the NPN transistors, wherein the N-type semiconductor source and drain region provided in the P-type well comprise an NMOS transistor, and the P-type semiconductor source and drain region comprise a PMOS transistor, and the NMOS transistor and the PMOS transistor comprise one said CMOS transistor in said array of the CMOS transistors; and wherein the array of the electrothermal converters, the array of the NPN transistors for flowing current into the electrothermal converters, and the array of the CMOS transistors for controlling operation of the NPN transistors are each arranged at the surface side of the common substrate in parallel to one another, and integrally, the array of the CMOS transistors constituting a shift register, a latch circuit, and a logic gate.

4. An integrated circuit of a recording head which records with an ink and having an orifice plate having a plurality of ink orifices and connected to a common substrate comprising:

a plurality of electrothermal converters each for generating thermal energy to heat the ink to emit the ink from an associated said ink orifice, said electrothermal convertors being disposed in an array;

said common substrate including said plurality of electrothermal converter elements and having a surface side and an array of a plurality of NPN transistors for conducting electrical currents to said electrothermal converters, and an array of a plurality of CMOS transistors for controlling operation of said NPN transistors, said substrate comprising:

a P-type semiconductor common substrate;

a first and a second N-type semiconductor buried layer each provided on the P-type common substrate;

a P-type semiconductor buried layer provided on the P-type common substrate;

an N-type semiconductor epitaxial layer provided on the first and the second N-type semiconductor buried layer and the P-type semiconductor buried layer;

a P-well of a P-type semiconductor material provided in the N-type semiconductor epitaxial layer;

an N-well of an N-type semiconductor material provided in the N-type semiconductor epitaxial layer;

a P-type semiconductor diffusion layer provided in the N-type semiconductor epitaxial layer and including a P-type semiconductor source and a drain region which are provided in the N-type well; and an N-type semiconductor diffusion layer provided in the P-type semiconductor diffusion layer and including an N-type semiconductor source and a drain region which are provided in the P-type well, wherein the buried layer of the first N-type semiconductor, the N-type semiconductor epitaxial layer, the P-type semiconductor diffusion layer provided in the N-type epitaxial layer, and the N-type semiconductor diffusion layer provided in the P-type semiconductor diffusion layer together comprises one said NPN transistor in said array of the NPN transistors, wherein the N-type semiconductor source and drain region provided in the P-type well comprise an NMOS transistor, and the P-type semiconductor source and drain region comprise a PMOS transistor, and the NMOS transistor and the PMOS transistor comprise one said CMOS transistor in said array of the CMOS transistors; and wherein the array of the electrothermal converters, the array of the NPN transistors for flowing current into the electrothermal converters, and the array of the CMOS transistors for controlling operation of the NPN transistors are each arranged at the surface side of the common substrate in parallel to one another, and integrally, the array of the CMOS transistors constituting a shift register, a latch circuit, and a logic gate.

* * * * *

UNITED STATES PATENT AND TRADEMARK OFFICE
CERTIFICATE OF CORRECTION

PATENT NO. : 5,602,576

DATED : February 11, 1997

INVENTOR(S) : FUMIO MUROOKA ET AL.

It is certified that error appears in the above-identified patent and that said Letters Patent is hereby corrected as shown below:

Title page,

AT [57] ABSTRACT

"electrothermal" should read --electro-thermal--, and "transisfor" should read --transistor--.

COLUMN 1

Line 17, "a various kind" should read --various kinds--.
Line 27, "of the" should read --of--.
Line 45, "to thereby to" should read --to thereby--.
Line 65, "respectively," should read --respectively to--.

COLUMN 2

Line 6, "above described" should read --above-described--.
Line 8, "high voltage proof" should read --high-voltage-proof--.
Line 15, "and" should read --an--.
Line 23, "serving" should read --serving as--.
Line 29, "serving" should read --serving as--.
Line 41, "above described" should read --above-described--.
Line 44, "high voltage proof" should read --high-voltage-proof--.
Line 53, "high voltage proof," should read --high-voltage-proof,--.
Line 55, "comparing" should read --compared--.
Line 66, "above described" should read --above-described-- and "following" should read --the following--.

UNITED STATES PATENT AND TRADEMARK OFFICE

CERTIFICATE OF CORRECTION

PATENT NO. : 5,602,576
DATED : February 11, 1997
INVENTOR(S) : FUMIO MUROOKA ET AL.

It is certified that error appears in the above-identified patent and that said Letters Patent is hereby corrected as shown below:

COLUMN 3

Line 12, "eelements" should read --elements--.
Line 37, "above men-" should read --above-men- --.

COLUMN 5

Line 5, "the for" should read --the bipolar NPN transistor. The converter element 11 is, for--.
Line 6, "bipolar NPN transistor. The" should be deleted.
Line 7, "converter element 11 is," should be deleted.
Line 22, "high" should read --high- --.
Line 23, "voltage proof" should read --voltage-proof--.
Line 28, "high volt-" should read --high-volt- --.
Line 29, "age proof" should read --age-proof--.
Line 37, "same" should read --the same--.
Line 39, "voltage proof" should read --voltage-proof--.
Line 47, "components," should read --component,--.

COLUMN 6

Line 5, "generated" should read --generate--.
Line 7, "are" should read --is--.
Line 29, "an" should read --in--.
Line 30, "plural, as" should read --plural--.
Line 31, "disclosed" should read --as disclosed--.
Line 61, "1" should be deleted.
Line 62, "11" should read --111--.

UNITED STATES PATENT AND TRADEMARK OFFICE
CERTIFICATE OF CORRECTION

PATENT NO. : 5,602,576

DATED : February 11, 1997

INVENTOR(S) : FUMIO MUROOKA ET AL.

It is certified that error appears in the above-identified patent and that said Letters Patent is hereby corrected as shown below:

COLUMN 7

Line 21, "above described" should read --the above-described--.
Line 27, "applied a" should read --applied with a--.
Line 60, "equal" should read --equal to--.

COLUMN 8

Line 4, "a" should read --an orifice plate comprising a-- and "orifices;" should read --orifices and connected to a common substrate;--.
Line 5, "an orifice plate comprising" should be deleted.
Line 8, "convertors" should read --converters--.
Line 42, "sistors" should read --sistor--.
Line 48, "transistors" should read --transistor--.

UNITED STATES PATENT AND TRADEMARK OFFICE
CERTIFICATE OF CORRECTION

PATENT NO. : 5,602,576

DATED : February 11, 1997

INVENTOR(S) : FUMIO MUROOKA ET AL.

It is certified that error appears in the above-identified patent and that said Letters Patent is hereby corrected as shown below:

COLUMN 9

Line 49, should read --an orifice plate comprising a plurality of ink orifices and--.
Line 50, "substrate" should read --substrate;--.
Line 54, "vertors" should read --verters--.

Signed and Sealed this

Twenty-first Day of October 1997

Attest:

BRUCE LEHMAN

Attesting Officer

*Commissioner of Patents and Trademarks*